(12) United States Patent
Kato

(10) Patent No.: US 10,002,753 B2
(45) Date of Patent: Jun. 19, 2018

(54) CHAMFERING APPARATUS AND METHOD FOR MANUFACTURING NOTCHLESS WAFER

(71) Applicant: SHIN-ETSU HANDOTAI CO., LTD., Tokyo (JP)

(72) Inventor: Tadahiro Kato, Annaka (JP)

(73) Assignee: SHIN-ETSU HANDOTAI CO., LTD., Tokyo (JP)

( * ) Notice: Subject to any disclaimer, the term of this patent is extended or adjusted under 35 U.S.C. 154(b) by 121 days.

(21) Appl. No.: 15/037,067

(22) PCT Filed: Oct. 29, 2014

(86) PCT No.: PCT/JP2014/005458
§ 371 (c)(1),
(2) Date: May 17, 2016

(87) PCT Pub. No.: WO2015/083319
PCT Pub. Date: Jun. 11, 2015

(65) Prior Publication Data
US 2016/0300708 A1 Oct. 13, 2016

(30) Foreign Application Priority Data
Dec. 3, 2013 (JP) ................................ 2013-250122

(51) Int. Cl.
*H01L 21/02* (2006.01)
*B24B 49/04* (2006.01)
(Continued)

(52) U.S. Cl.
CPC ........ *H01L 21/02021* (2013.01); *B24B 9/065* (2013.01); *B24B 49/02* (2013.01);
(Continued)

(58) Field of Classification Search
CPC ........... B24B 7/228; B24B 7/241; B24B 9/00; B24B 9/02; B24B 9/065; B24B 49/02;
(Continued)

(56) References Cited

U.S. PATENT DOCUMENTS 5,117,590 A * 6/1992 Kudo ...................... B24B 9/065
451/239
5,555,091 A 9/1996 Kagamida
(Continued)

FOREIGN PATENT DOCUMENTS

| JP | H07-218228 A | 8/1995 |
|---|---|---|
| JP | H10-256106 | 9/1998 |

(Continued)

OTHER PUBLICATIONS

Sep. 29, 2016 Search Report issued in Taiwanese Application Patent No. 103138921.
(Continued)

*Primary Examiner* — Timothy V Eley
(74) *Attorney, Agent, or Firm* — Oliff PLC

(57) ABSTRACT

A chamfering apparatus including chamfering part for removing notch, cleaning part for cleaning and drying wafer, and chamfered-shape measuring part for measuring chamfered shape, each of chamfering and cleaning part, and chamfered-shape measuring part including rotatable stage for holding wafer and control unit for controlling rotational positions of rotatable stage and wafer, rotatable stage having reference position serving as reference of rotational positions at beginning of rotation, wherein wafer is held wherein rotational position of wafer at beginning of rotation relative to reference position is at same rotational position on all rotatable stages, and control unit to control rotational position of wafer to be at predetermined position at beginning and end of rotation. As a result, the chamfering apparatus
(Continued)

and method for manufacturing notchless wafer allowing appropriate feedback control even in notchless wafer, suppress variation in chamfered shape dimension, and achieve desired cross-sectional shape precision of wafer chamfered portion.

8 Claims, 9 Drawing Sheets

(51) Int. Cl.
    *B24B 49/02*     (2006.01)
    *B24B 9/06*     (2006.01)
    *B24B 49/12*     (2006.01)
    *H01L 23/544*     (2006.01)

(52) U.S. Cl.
    CPC .............. *B24B 49/04* (2013.01); *B24B 49/12* (2013.01); *H01L 21/02052* (2013.01); *H01L 23/544* (2013.01); *H01L 2223/54493* (2013.01)

(58) Field of Classification Search
    CPC ......... B24B 49/04; B24B 49/12; B24B 51/00; H01L 21/304; H01L 21/02021; H01L 21/02052; H01L 23/544; H01L 2223/54493
    See application file for complete search history.

(56) References Cited

U.S. PATENT DOCUMENTS

| | | | | |
|---|---|---|---|---|
| 5,882,539 A | * | 3/1999 | Hasegawa | B24B 9/065 216/52 |
| 5,927,263 A | * | 7/1999 | Muramatsu | B28D 5/00 125/13.01 |
| 5,993,292 A | | 11/1999 | Oishi et al. | |
| 6,431,961 B1 | * | 8/2002 | Katayama | B24B 9/065 257/E21.237 |
| 7,806,751 B2 | * | 10/2010 | Suzuki | G11B 5/8404 451/44 |
| 9,589,901 B2 | * | 3/2017 | Koo | H01L 23/544 |
| 2006/0252355 A1 | | 11/2006 | Kumasaka | |
| 2008/0153391 A1 | | 6/2008 | Erk et al. | |
| 2009/0324896 A1 | | 12/2009 | Kato | |
| 2010/0099337 A1 | | 4/2010 | Kerstan et al. | |
| 2011/0003537 A1 | | 1/2011 | Fukushima et al. | |
| 2011/0140244 A1 | | 6/2011 | Schwarzenbach et al. | |
| 2011/0146703 A1 | | 6/2011 | Chen et al. | |
| 2012/0100785 A1 | | 4/2012 | Ishimasa et al. | |

FOREIGN PATENT DOCUMENTS

| | | |
|---|---|---|
| JP | 2010-247273 A | 11/2010 |
| TW | 200616758 A | 6/2006 |
| TW | 200904587 A | 2/2009 |
| TW | 201016389 A | 5/2010 |
| TW | 201131647 A | 9/2011 |
| TW | 201142939 A | 12/2011 |
| WO | 2008/093488 A1 | 8/2008 |

OTHER PUBLICATIONS

Feb. 3, 2015 International Search Report issued in International Patent Application No. PCT/JP2014/005458.

* cited by examiner

CHAMFERING APPARATUS AND METHOD FOR MANUFACTURING NOTCHLESS WAFER

TECHNICAL FIELD

The present invention relates to a chamfering apparatus and a method for manufacturing a notchless wafer.

BACKGROUND ART

It has been conventional to form a cut called notch on an outer circumference of a wafer such as a single crystal silicon wafer having a diameter of 300 mm or more in order to align the wafer in a manufacturing process. The wafer is sliced along a certain crystal orientation so as to make the crystal structure most appropriate for the operation of a semiconductor device to be manufactured. The notch position is determined, depending on a conductivity type and a crystal orientation, in a direction of the crystal orientation such as <110> and <100>.

Recently, along with a high integration of a semiconductor device such as DRAM, NAND flash memory, and MPU and a diameter enlargement of a wafer, there is increased a stress applied to the wafer during heat treatment in the process for manufacturing a semiconductor device, and there arises a problem of slipping, which causes a junction leak. In particular, the stress concentration is easily generated at a portion having a local shape such as a notch, easily causing slipping. Therefore, device makers have demanded a wafer having no cut such as notch.

In the method for manufacturing a silicon wafer used as a semiconductor memory device material, first, a silicon crystal ingot having a specific crystal orientation is produced by the Czochralski (CZ) method or other method (a crystal growing process). Then, the produced single crystal ingot is ground to adjust the outer diameter, and a notch for indicating the crystal orientation is formed on an outer circumference of the single crystal ingot (a cylindrical grinding process). Then, the single crystal ingot is sliced into a thin disk-shaped wafer along the specific crystal orientation (slicing step), and an outer circumference of the sliced wafer is chamfered to prevent the wafer from cracking and chipping (a chamfering process).

Thereafter, both surfaces of the chamfered wafer are flattened by grinding (a double-disc grinding process), and mechanical damage remaining in the wafer chamfered and double-side polished is removed (an etching process). Further, the front surface and/or the back surface of the wafer are mirror-polished (a polishing process), and the polished wafer is cleaned to remove a polishing agent and foreign substances attached thereto (a cleaning process).

The method for manufacturing a wafer having no notch (notchless wafer) by the above manufacturing process includes, as shown in FIG. 5, stamping a crystal orientation mark on the back surface of the double-disk ground wafer by laser marking with reference to the notch (a laser marking process) and removing the notch by grinding the outer circumference of the laser-marked wafer (a notch removing process) (see Patent Document 1). A crystal orientation mark M shown in FIG. 6 formed by laser on the back surface of the wafer W instead of the notch is under development by Semiconductor Equipment and Materials Institute (SEMI).

CITATION LIST

Patent Literature

Patent Document 1: Japanese Unexamined Patent publication (Kokai) No. H10-256106

Patent Document 2: Japanese Unexamined Patent publication (Kokai) No. H07-218228
Patent Document 3: WO2008/093488

SUMMARY OF INVENTION

Technical Problem

In general, with the miniaturization of a semiconductor memory, strict requirements are imposed on a standard value and a variation in a chamfered shape of an outer circumferential portion of a wafer such as a semiconductor silicon wafer. This is because an immersion exposure is generally used in a device exposure process, and the variation in the shape of a wafer chamfered portion causes leak of an immersion liquid. Moreover, it has been said that if the wafer chamfered shape is abnormal in a device heat treatment process, thermal shock due to shortening of heat cycles induces wafer breakage (cracks) derived from the abnormal point.

To suppress the variation in the chamfered shape, a controlling method which includes measuring a cross-sectional shape of the chamfered portion and promptly feeding back the cross-sectional shape of the chamfered portion at every circumferential position with a wafer-chamfering apparatus incorporating a measuring machine for measuring the cross-sectional shape of the chamfered portion is employed for manufacturing a silicon wafer (see Patent Document 2). The cross-sectional shape of the chamfered portion is calculated by binarizing a captured image in a transmitted light manner. FIG. 7 shows typical parameters of the shape of the chamfered portion. The parameters such as chamfer angles $\theta_1$, $\theta_2$, chamfer widths on front and back surfaces A1, A2, tip radii R1, R2, and a width of a tip portion BC are controlled so as to be within predetermined value ranges.

FIG. 8 shows an example of a controlled chamfered shape. When the measurement shows an inequality between A1 and A2 shown in FIG. 7, it is judged that a grindstone center does not coincide with a wafer center, and then a relative position between the grindstone and the wafer in a chamfering part is corrected according to the following formula (1). In the formula, $\delta$ represents a correction amount of the relative position between the grindstone and the wafer, A1 and A2 represent chamfer widths on front and back surfaces of a wafer, and $\theta$ represents a chamfer angle.

$$\delta = \{(A1-A2) \times \tan\theta\}/2 \tag{1}$$

In addition, because an alkali aqueous solution such as caustic soda or caustic potassium, which has etching speed anisotropy depending on a crystal orientation of a wafer, is used in the etching process, the cross-sectional shape fluctuates in a chamfering circumferential direction. Therefore, it has been suggested to adjust the chamfered shape depending on a circumferential position of the wafer (see Patent Document 3).

The above chamfered-shape control includes aligning a wafer with reference to a notch, then measuring the chamfered shape at each point in the circumferential direction, and controlling a chamfering based on the result. Accordingly, when the method for manufacturing a notchless wafer includes the notch removing process, the cross-sectional shape of the wafer chamfered portion cannot be measured with reference to the notch after removing the notch, and thus feedback and shape control of the chamfered portion at chamfering cannot be performed. As a result, there arises a problem that the wafer chamfered portion does not meet customer requirements on cross-sectional shape precision.

By contrast, when an alignment method using a crystal orientation mark stamped on a wafer back surface is employed, the chamfering apparatus requires an additional expensive alignment mechanism to detect the crystal orientation mark, thus resulting in costly.

The present invention has been made in view of the above problems, and an object thereof is to provide a chamfering apparatus and a method for manufacturing a notchless wafer that allow a feedback control according to the crystal orientation, can suppress the variation in a chamfered shape dimension of a notchless wafer, and can achieve cross-sectional shape precision of the wafer chamfered portion, required by a customer, at low cost even in the case of using a measured value of the cross-sectional shape of the chamfered portion of the notchless wafer.

Solution to Problem

To achieve this object, the present invention provides a chamfering apparatus comprising: a chamfering part for removing a notch by grinding an outer circumference of a wafer with a grindstone; a cleaning part for cleaning and drying the chamfered wafer; and a chamfered-shape measuring part for measuring a chamfered shape of the wafer washed and dried, each of the chamfering part, the cleaning part, and the chamfered-shape measuring part including a rotatable stage for rotatably holding the wafer and a control means for controlling a rotational position of the rotatable stage and a rotational position of the wafer held on the rotatable stage, the rotatable stage having a reference position serving as a reference of the rotational positions at the beginning of rotation, wherein the wafer is held such that the rotational position of the wafer at the beginning of rotation relative to the reference position is at the same rotational position on all the rotatable stages, and the control means is configured to control the rotational position of the wafer so as to be at a predetermined position at the beginning and the end of rotation.

Such an apparatus enables a circumferential position of the wafer at which the cross-sectional shape of the chamfered portion is measured to coincide with a circumferential position of the wafer at which the wafer is brought into contact with the grindstone at chamfering, and can feed back a measured value of the cross-sectional shape to use the measured value for a chamfering control at the corresponding rotational position of the wafer to be chamfered. Consequently, circumferential variation in the chamfered shape dimension of the notchless wafer can be suppressed, and cross-sectional shape precision of the wafer chamfered portion required by a customer can be achieved. Moreover, because it is unnecessary to add an expensive alignment mechanism to the chamfering apparatus, a notchless wafer with high cross-sectional shape precision of the chamfered portion can be manufactured at low cost.

The control means is preferably further configured to control the rotational position of the rotatable stage so as to be within ±0.05 degree relative to the predetermined position at the beginning and the end of rotation.

According to such a configuration, it is possible to surely achieve a chamfered shape precision such that a position accuracy is within ±0.1 degree from the crystal orientation indicated by the crystal orientation mark stamped on the back surface of the wafer, thus enabling to surely obtain a wafer with high precision of the shape of the chamfered portion.

The control means preferably includes a servomotor disposed at the rotatable stage and a rotary encoder built in the servomotor, the rotary encoder being capable of detecting the rotational positions, the servomotor being capable of controlling the rotational positions.

According to such a configuration, the rotational position of the wafer can be easily controlled so as to be at a predetermined position at the beginning and the end of rotation. Especially, the rotational position of each rotatable stage can be controlled so as to be within ±0.05 degree relative to the predetermined position at the beginning and the end of rotation, thus enabling to surely obtain a wafer with high precision of the shape of the chamfered portion.

Furthermore, the present invention provides a method for manufacturing a notchless wafer, the method comprising: stamping a crystal orientation mark at a certain position on a back surface of a wafer having a notch with respect to a certain crystal orientation by laser marking with reference to the notch; and chamfering the wafer to remove the notch, the chamfering including a chamfering step for removing the notch by grinding an outer circumference of the wafer aligned with reference to the notch with a grindstone, a cleaning step for cleaning and drying the wafer from which the notch is removed, and a chamfered-shape measuring step for measuring a chamfered shape of the wafer, wherein in each of the steps, the wafer is rotatably held on a rotatable stage such that a rotational position of the wafer at the beginning of rotation relative to a reference position is at the same rotational position on all the rotatable stages, wherein the reference position serves as a reference of the rotational position, and the rotational position of the wafer held on the rotatable stage is controlled so as to be at a predetermined position at the beginning and the end of rotation.

Such a method enables a circumferential position of the wafer at which the cross-sectional shape of the chamfered portion is measured to coincide with a circumferential position of the wafer at which the wafer is brought into contact with the grindstone at chamfering, and can feed back a measured value of the cross-sectional shape to use the measured value for a chamfering control at the corresponding rotational position of the wafer to be chamfered. Consequently, circumferential variation in the chamfered shape dimension of the notchless wafer can be suppressed, and cross-sectional shape precision of the wafer chamfered portion required by a customer can be achieved. Moreover, because it is unnecessary to add an expensive alignment mechanism to the chamfering apparatus, a notchless wafer with high cross-sectional shape precision of the chamfered portion can be manufactured at low cost.

A rotational position of the rotatable stage is preferably controlled so as to be within an accuracy of ±0.05 degree relative to the predetermined position at the beginning and the end of rotation.

In this manner, it is possible to surely achieve a chamfered shape precision such that a position accuracy is within ±0.1 degree from the crystal orientation indicated by the crystal orientation mark stamped on the back surface of the wafer, thus enabling to surely obtain a wafer with high precision of the shape of the chamfered portion.

A servomotor and a rotary encoder built therein are preferably disposed at the rotatable stage, the rotary encoder being capable of detecting the rotational position, the servomotor being capable of controlling the rotational position.

In this manner, the rotation position of the wafer can be easily controlled so as to be at a predetermined position at the beginning and the end of rotation. Especially, the rotational position of the rotatable stage can be controlled so as to be within ±0.05 degree relative to the predetermined position at the beginning and the end of rotation, thus enabling to surely obtain a wafer with high precision of the shape of the chamfered portion.

Advantageous Effects of Invention

The chamfering apparatus and the method for manufacturing a notchless wafer of the present invention allow a chamfering control according to a crystal orientation of a wafer even in a notchless wafer, can suppress circumferential variation in the chamfered shape dimension, and can achieve chamfered shape precision equivalent to a conventional wafer having a notch for indicating a crystal orientation. Moreover, because it is unnecessary to add an expensive alignment mechanism for detecting the laser mark to the chamfering apparatus, a notchless wafer with cross-sectional shape precision of the wafer chamfered portion, required by a customer, can be manufactured at low cost.

DESCRIPTION OF EMBODIMENTS

Hereinafter, embodiments of the present invention will be described, but the present invention is not limited thereto.

In recent years, device makers have demanded a wafer having no cut such as notch in many cases. However, when a notch is removed from a wafer, the cross-sectional shape of the wafer chamfered portion cannot be measured with reference to the notch, and thus feedback and shape control of the chamfered portion at chamfering cannot be performed. As a result, there arises a problem that the wafer chamfered portion does not meet customer requirements on cross-sectional shape precision.

In view of this, the present inventor repeatedly and keenly conducted studies to solve the problem, and consequently found that when the chamfering apparatus is configured to control the rotational position of the wafer held on the rotational stage so as to be at a predetermined position at the beginning and the end of rotation, a measured value of the cross-sectional shape of the chamfered portion can be fed back to use the measured value for a chamfering control at the corresponding rotational position of the wafer to be chamfered, whereby cross-sectional shape precision of the wafer chamfered portion can be improved. Thus, the present invention was brought to completion.

Hereinafter, the inventive chamfering apparatus and the inventive method for manufacturing a notchless wafer will be described with reference to FIGS. 1 to 4.

Figure 1:
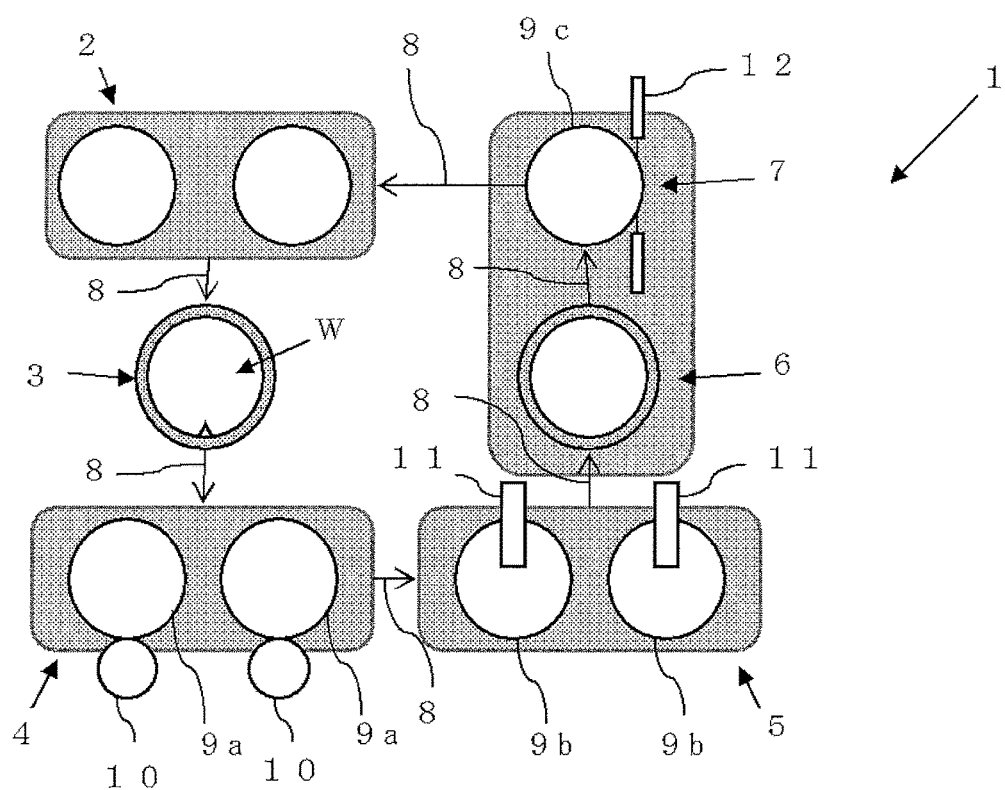
FIG. 1 is a schematic diagram showing an example of the inventive chamfering apparatus.

As shown in FIG. 1, the inventive chamfering apparatus 1 is composed of a wafer feeding/accommodating part 2, an alignment part 3, a chamfering part 4, a cleaning part 5, a centering part 6, a chamfered-shape measuring part 7, and conveying parts 8 for conveying a wafer W among these parts.

The wafer feeding/accommodating part 2 feeds a wafer W having a notch before chamfered, and accommodates the wafer W having no notch into a container after chamfered and subjected to a measurement to measure the cross-sectional shape of the chamfered portion in the later-described chamfered-shape measuring part 7. The alignment part 3 performs a centering alignment and a notch-position alignment of the wafer W having a notch, taken out from the container of the wafer feeding/accommodating part 2.

Figure 2:
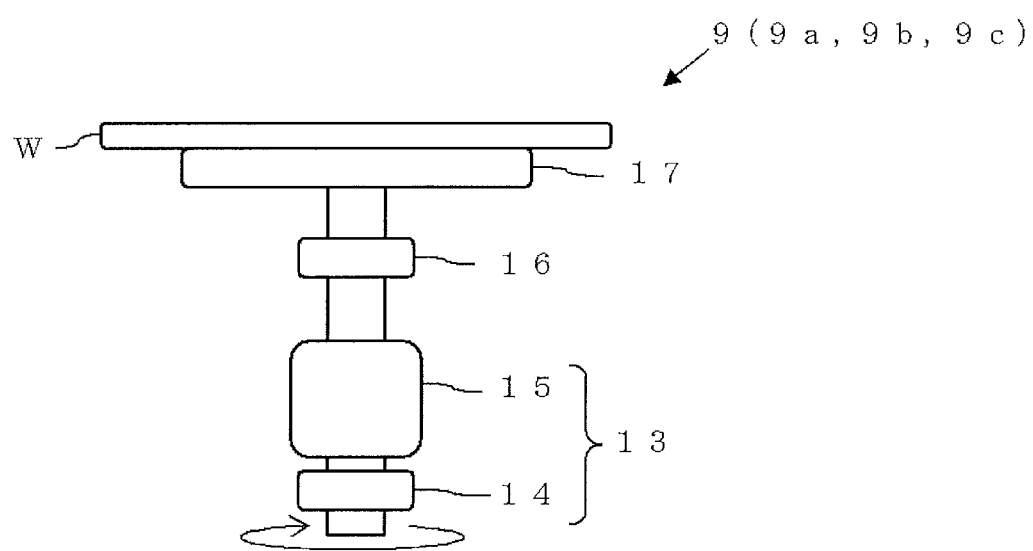
FIG. 2 is a schematic diagram showing an example of the rotatable stage in the inventive chamfering apparatus.

The chamfering part 4 includes rotatable tables 9a for rotatably holding the wafer W and grindstones 10 for removing the notch by grinding the outer circumferential portion of the wafer. As shown in FIG. 2, the rotatable table 9a has a control means 13. The control means 13 is capable of controlling the rotation, thereby controlling the rotational position of the held wafer W.

The cleaning part 5 cleans and dries the wafer W chamfered in the chamfering part 4. The cleaning part 5 includes rotatable tables 9b for rotatably holding the wafer W and cleaning liquid supply mechanisms 11 for supplying a cleaning liquid to clean the wafer W. The wafer W in which the outer circumferential portion has been chamfered is cleaned with the cleaning liquid, such as pure water, supplied from the cleaning liquid supply mechanism 11. The wafer W is then rotated by rotating the rotatable table 9b to dry the wafer by spinning. The rotatable table 9b also has the same control means 13 as the rotatable table 9a, as shown in FIG. 2. The control means 13 is capable of controlling the rotation, thereby controlling the rotational position of the held wafer W.

The centering part 6 centers the wafer W cleaned and dried in the cleaning part 5. The chamfered-shape measuring part 7 includes a rotatable table 9c for rotatably holding the wafer W and a shape measuring machine 12 for measuring the cross-sectional chamfered shape of the outer circumferential portion of the wafer W. In the chamfered-shape measuring part 7, the cross-sectional chamfered shape is measured at a certain point on the circumference of the wafer W by the shape measuring machine 12. A control value is obtained from the shape data at the certain point on the circumference of the wafer W, and the control value is fed back to the chamfering part 4 and then used for a chamfering control. The shape measuring machine 12 may be, for example, a shape measuring machine in a transmitted light manner. The rotatable table 9c also has the same control means 13 as the rotatable tables 9a, 9b, as shown in FIG. 2. The control means 13 is capable of controlling the rotation, thereby controlling the rotational position of the held wafer W.

In the present invention, as mentioned above, each of the chamfering part 4, the cleaning part 5, and the chamfered-shape measuring part 7 includes a rotatable stage 9 (9a, 9b, 9c) for rotatably holding the wafer and a control means for controlling a rotational position of the rotatable stage 9 and a rotational position of the wafer W held on the rotatable stage 9. The rotatable stage 9 has a reference position serving as a reference of the rotational positions at the beginning of rotation, and the wafer W is held such that the rotational position of the wafer W at the beginning of rotation is at the same rotational position relative to the reference position on all the rotatable stages. The control means 13 is configured to control the rotational position of the wafer W so as to be at a predetermined position at the beginning and the end of rotation, on all the rotatable stages. Herein, the reference position may be, for example, a position at which a processing device of the respective parts, such as the grindstone 10 for chamfering, the cleaning liquid supply mechanism 11 for cleaning, and the shape measuring machine 12, is placed.

Here, it is important to make the circumferential position of the notchless wafer at which the cross-sectional chamfered shape is measured coincident with the contact position with the grindstone at chamfering, and to use data obtained from the cross-sectional shape measurement for a chamfering control at the corresponding rotational position. In the conventional chamfering apparatus, since the chamfered wafer W does not have a notch, the rotational position of the wafer with reference to the notch cannot be detected by an alignment before measurement of the cross-sectional chamfered shape of the wafer.

By contrast, according to the present invention, the orientation of the wafer W is always kept constant among the chamfering part 4, the cleaning part 5, and the chamfered-shape measuring part 7 by the rotatable stage 9 and the control means 13 as described above, whereby the circumferential position relative to the crystal orientation of the notchless wafer at which the cross-sectional chamfered shape is measured is made coincident with the position relative to the crystal orientation at which the wafer is brought into contact with the grindstone at chamfering, and data obtained from the cross-sectional shape measurement can be used for a chamfering control at the rotational position corresponding to the crystal orientation on the circumference of the wafer W.

In addition, as shown in FIG. 2, the control means 13 preferably includes a servomotor 15 capable of detecting the rotational positions and a rotary encoder 14 built therein and capable of controlling the rotational positions. The control means 13 is connected to a vaccum chuck stage 17 for holding the wafer W by vacuum suction, via a rotary joint 16. Thus the rotational positions of the rotatable stage 9 and the wafer W held thereon are controlled.

Figure 3:
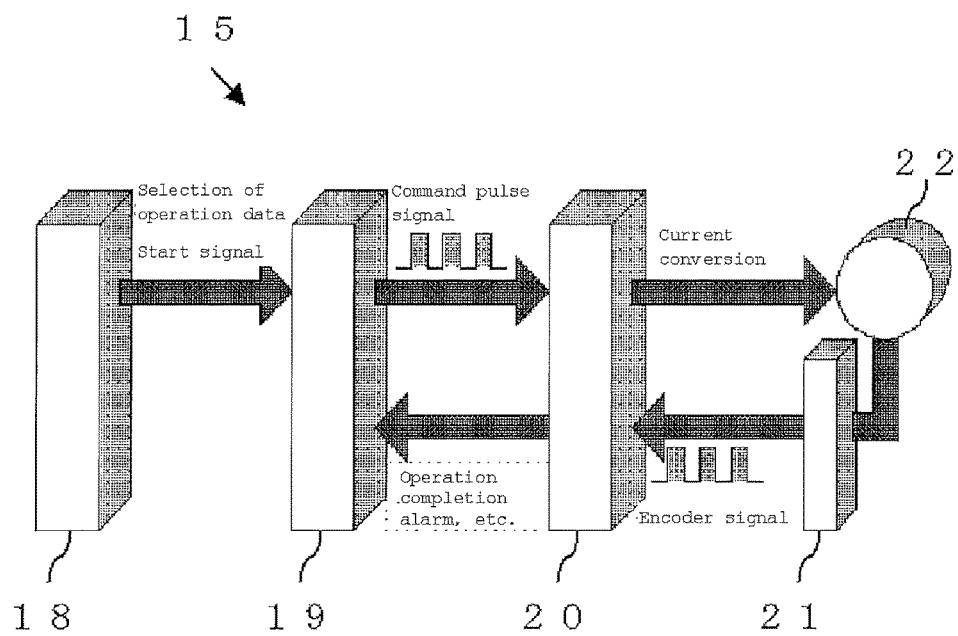
FIG. 3 is a schematic diagram showing an exemplary control manner of a servomotor in the control means.
Figure 4:
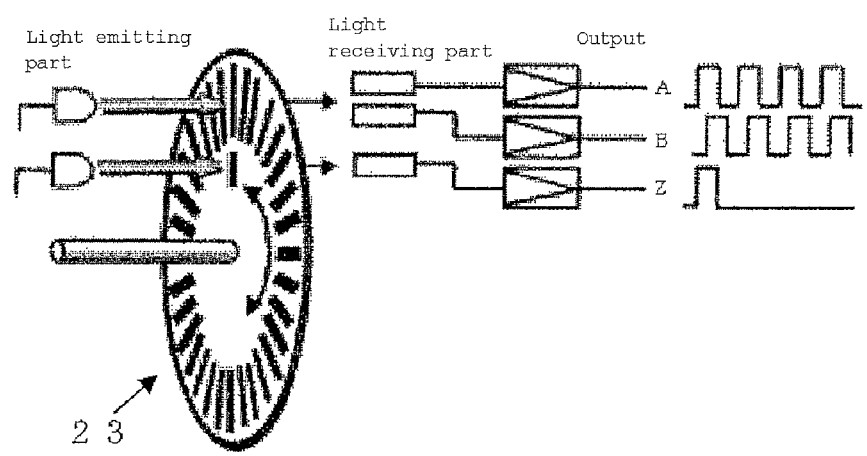
FIG. 4 is a schematic diagram showing an exemplary mechanism of a rotary encoder in the control means.
Figure 5:
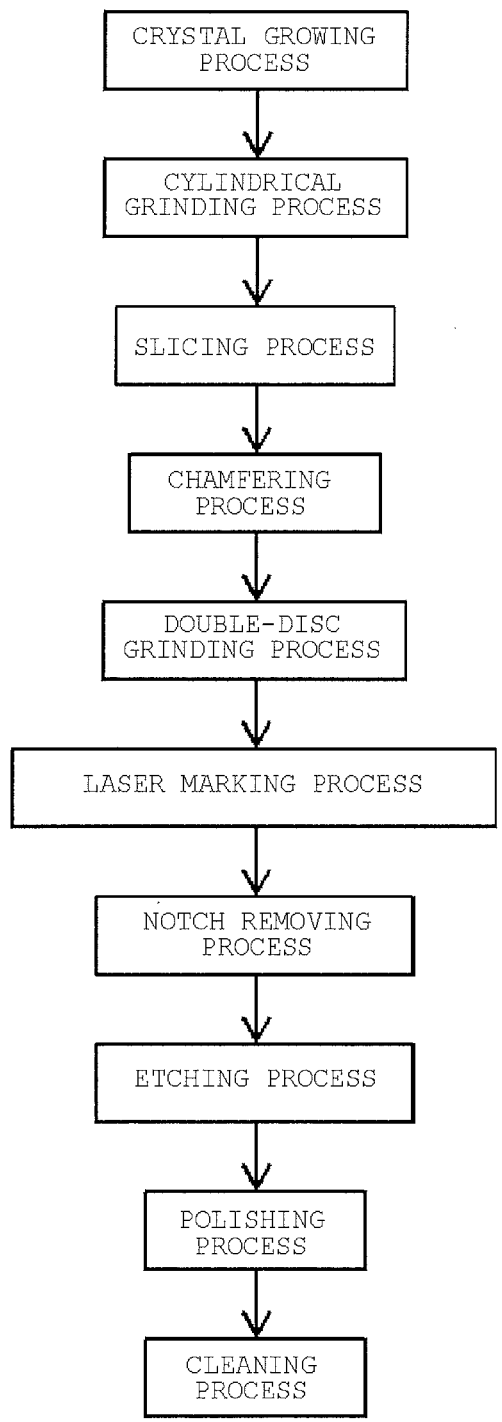
FIG. 5 is a flow chart showing an example of a general method for manufacturing a notchless wafer.
Figure 6:
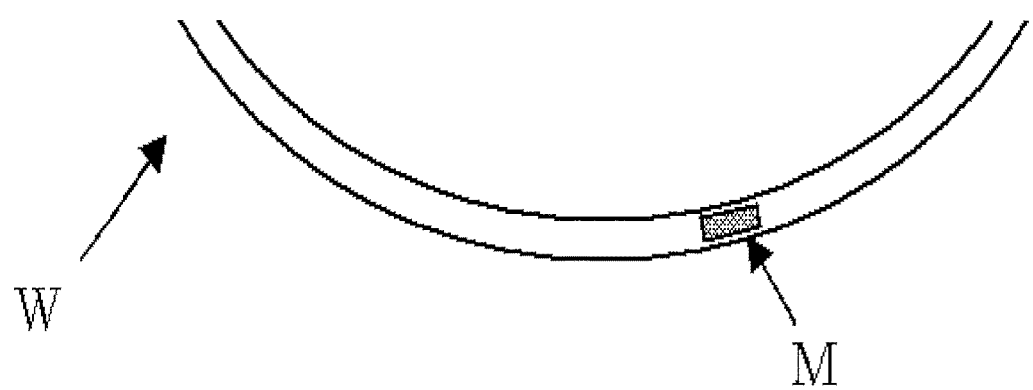
FIG. 6 is a diagram showing an example of a laser mark stamped on a back surface of a wafer.
Figure 7:
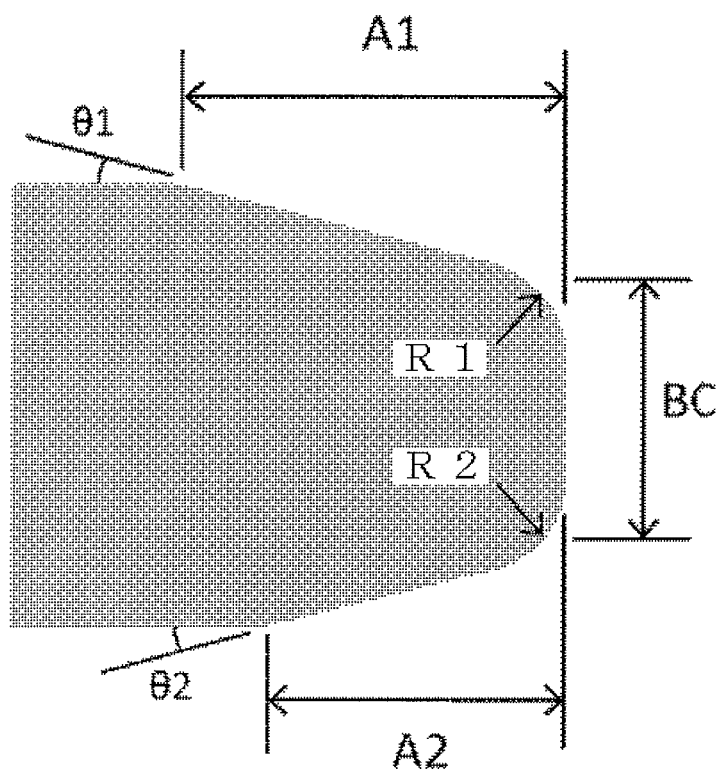
FIG. 7 is a schematic diagram showing typical parameters of the shape of a chamfered portion.
Figure 8:
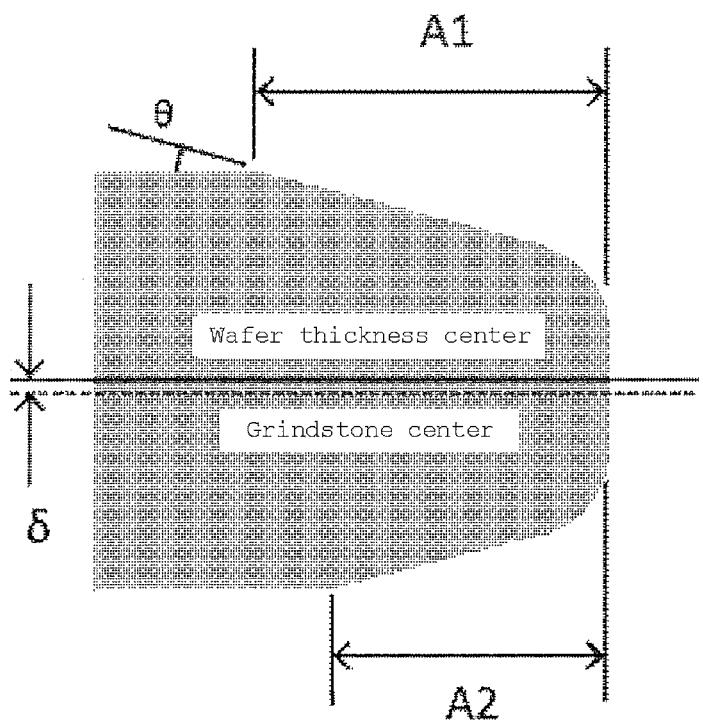
FIG. 8 is a schematic diagram showing an example of a controlled chamfered shape.

As shown in FIG. 3, the servomotor 15 feeds back the rotational speed and the rotational position and operates according to a command, by a servo mechanism composed of a PLC 18, a pulse oscillation controller 19, a driver 20, an encoder 21, a motor 22, and other components. As shown in FIG. 4, the rotary encoder 14 is an angular position sensor that can convert the change in rotation of the input shaft into an output digital signal with a built-in encoder disk 23. This rotary encoder 14 enables a precise detection of the rotational position.

Thus, when the control means 13 includes the servomotor 15 and the rotary encoder 14 built therein, the rotational position of the wafer can be easily controlled so as to be at a predetermined position at the beginning and the end of rotation. Especially, the rotational position of each rotatable stage can be controlled so as to be within ±0.05 degree relative to the predetermined position at the beginning and the end of rotation, thus enabling to surely obtain a wafer with high precision of the shape of the chamfered portion.

Moreover, variation of position accuracy of the crystal orientation <100> or <110> corresponding to the notch orientation is desirably within ±0.1 degree. The accuracy to stop the rotatable stage 9, for rotatably sticking and holding the wafer, such that the rotational position of the rotatable stage is at a predetermined position among the chamfering part 4, the cleaning part 5, and the chamfered-shape measuring part 7 is determined as follows.

A total variation $\sigma_{total}$ of stop positions of the rotatable stages of the respective parts is expressed by the following formula (2):

$$\sigma_{total} = \{(\sigma_1)^2 + (\sigma_2)^2 + (\sigma_3)^2\}^{1/2} \qquad (2)$$

where $\sigma_1$ represents a variation of a stop position of the rotatable stage 9a of the chamfering part 4 relative to a certain position of the rotatable stage 9a at the beginning and the end of rotation, $\sigma_2$ represents a variation of a stop position of the rotatable stage 9b of the cleaning part 5 relative to a certain position of the rotatable stage 9b at the beginning and the end of rotation, and $\sigma_3$ represents a variation of a stop position of the rotatable stage 9c of the chamfered-shape measuring part 7 relative to a certain position of the rotatable stage 9c at the beginning and the end of rotation.

A variation $\sigma_{goal}$ required by a customer may be $\sigma_{goal} < 3 \times 0.1$ (degree). Assuming all of the stop position variations of the respective rotatable stages are equal, each variation $\sigma_1$, $\sigma_2$, $\sigma_3$ of the position at which each rotatable stage is stopped is desirably within ±0.05 degree. Therefore, to meet the customer's requirements, the control means is preferably configured to control the rotational position of each rotatable stage so as to be within ±0.05 degree relative to the predetermined position at the beginning and the end of rotation.

The inventive method for manufacturing a notchless wafer will be now described based on an example using the inventive chamfering apparatus.

A crystal orientation mark is stamped at a certain position on the back surface of a wafer having a notch with respect to a certain crystal orientation, by laser marking with reference to the notch. The wafer is then accommodated in a container in the wafer feeding/accommodating part 2.

Then, the wafer W having the notch accommodated in the container in the wafer feeding/accommodating part 2 is taken out, and the wafer W is subjected to centering and notch position alignment in the alignment part 3.

Then, a chamfering step for removing the notch by grinding an outer circumference of the wafer aligned with reference to the notch with a grindstone is performed.

In this step, the wafer W having the notch is held on the rotatable stage 9a for rotatably holding the wafer W in the chamfering part 4. The wafer is here held on the rotatable stage 9a such that the rotational position of the wafer W at the beginning of rotation relative to the reference position, which serves as a reference of the rotational position at the beginning of rotation, is at the same rotational position as on the rotatable stage 9b and the rotatable stage 9c described later. The reference position may be, for example, a position at which a processing device of the respective parts, such as the grindstone 10 for chamfering, the cleaning liquid supply mechanism 11 for cleaning, and the shape measuring machine 12, is placed. The outer circumference of the wafer W is then brought into sliding contact with the grindstone and ground to remove the notch, while the rotational position of the wafer W held on the rotatable stage 9a is controlled by the control means 13 so as to be at a predetermined position at the beginning and the end of rotation.

Then, a cleaning step for cleaning and drying the wafer W from which the notch has been removed is performed. In the cleaning step, first, the chamfered wafer W is held on the rotatable stage 9b in the cleaning part 5. Also in this step, the wafer is held such that the rotational position of the wafer W at the beginning of rotation relative to the reference position, which serves as a reference of the rotational position at the beginning of rotation, is at the same rotational position as on the rotatable stage 9a and the rotatable stage 9c described later, in the same manner as the wafer W is held on the rotatable stage 9a as mentioned above. The wafer is cleaned with a cleaning liquid, such as pure wafer, supplied from the cleaning liquid supply mechanism 11 while the rotational position of the wafer W held on the rotatable stage 9b is controlled by the control means 13 so as to be at a predetermined position at the beginning and the end of rotation. After cleaning, the wafer is dried by spinning while controlling the rotational position in the same manner.

Then, the wafer is centered in the centering part 6.

After centering, a chamfered-shape measuring step for measuring a chamfered shape of the wafer W is performed in the chamfered-shape measuring part 7.

In the chamfered-shape measuring step, the centered wafer W is held on the rotatable stage 9c in the chamfered-shape measuring part 7. Also in this step, the wafer is held such that the rotational position of the wafer W at the beginning of rotation relative to the reference position, which serves as a reference of the rotational position at the beginning of rotation, is at the same rotational position on the rotatable stage, in the same manner as the wafer W is held on the rotatable stages 9a and 9b as mentioned above. The cross-sectional shape is then measured at a certain point on the circumference of the wafer W with the shape measuring machine 12 while the rotational position of the wafer W held on the rotatable stage 9c is controlled by the control means 13 so as to be at a predetermined position at the beginning and the end of rotation.

A control value obtained from the shape data at the certain point on the circumference of the wafer W is then fed back to the chamfering part 4 and used for a chamfering control. The cross-sectional shape of the chamfered portion is thus measured, and the measured wafer W is restored to the container of the wafer feeding/accommodating part 2.

The notchless wafer manufacture is then completed.

In such a method for manufacturing a notchless wafer, the orientation of the wafer on the rotatable stage is always kept constant among the chamfering step, the cleaning step, and the chamfered-shape measuring step, whereby the circumferential position of the notchless wafer at which the cross-sectional chamfered shape is measured is made coincident with the position at which the wafer is brought into contact with the grindstone at chamfering, and data obtained from the cross-sectional shape measurement can be used for a chamfering control at the corresponding rotational position. As a result, even in a notchless wafer, circumferential variation in the chamfered shape dimension can be suppressed, and deterioration of the cross-sectional shape precision can be inhibited. Furthermore, because it is unnecessary to use an expensive alignment mechanism for detecting a laser mark, a notchless wafer with high cross-sectional shape precision of the chamfered portion can be manufactured at low cost.

In the method, the rotational position of the rotatable stage 9 is preferably controlled so as to be within an accuracy of ±0.05 degree relative to the predetermined position at the beginning and the end of rotation.

In this manner, it is possible to surely achieve a chamfered shape precision such that a position accuracy is within ±0.1 degree from the crystal orientation indicated by the crystal orientation mark stamped on the back surface of the wafer, thus enabling to surely obtain a wafer with high precision of the shape of the chamfered portion.

Moreover, a servomotor capable of detecting the rotational position and a rotary encoder built therein and capable of controlling the rotational position are preferably disposed at the rotatable stage.

In this manner, the rotational position of the wafer can be easily controlled so as to be at a predetermined position at the beginning and the end of rotation. Especially, the rotational position of the rotatable stage can be controlled so as to be within ±0.05 degree relative to the predetermined position at the beginning and the end of rotation, thus enabling to surely obtain a wafer with high precision of the shape of the chamfered portion.

EXAMPLE

Hereinafter, the present invention will be described in more detail based on example and comparative example, but the present invention is not limited thereto.

Example

A single silicon wafer having a diameter of 450 mm and a crystal plane orientation (100) was prepared. The wafer had a notch for indicating a crystal axis orientation <110> and a crystal orientation mark stamped on the back surface by laser with reference to the notch. The wafer was then chamfered with the inventive chamfering apparatus as shown in FIG. 1 to remove the notch, thereby manufacturing a notchless wafer.

In the example, a circumferential position with respect to the crystal orientation of the notchless wafer at which the cross-sectional shape of the chamfered position was measured was made coincident with a portion with respect to the crystal orientation at which the wafer was brought into contact with the grindstone at chamfering, and data of the shape of the chamfered portion at each point on the circumference of the wafer obtained from the cross-sectional measurement could be used for a chamfering control at the corresponding rotational position.

Figure 9:
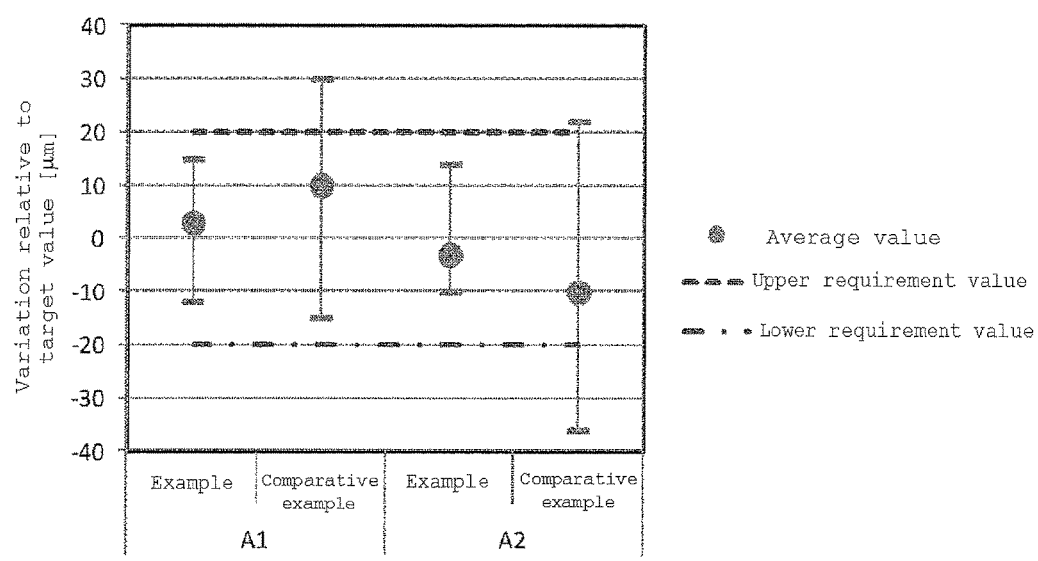
FIG. 9 is a diagram showing measurement result of variation in chamfer width in example and comparative example.

As a result, $\sigma_{total}$ in the formula (2) could be suppressed to 0.1 degree or less, variation in the chamfered shape could be controlled to be small, and variation between chamfer widths A1, A2 can be suppressed to ±20 μm or less, as shown in FIG. 9. Thus, a notchless wafer with high shape precision, which meets a standard required by a customer, could be obtained.

Comparative Example

A notchless wafer was manufactured under the same condition as in example, except that the rotational positions of the rotatable stage and the wafer held on the rotatable stage were not controlled so as to be at a predetermined position at the beginning and the end of rotation.

In the comparative example, the cross-sectional shape of the wafer chamfered position could not be measured with reference to the notch after removing the notch. Therefore, feedback and appropriate shape control of the chamfered position could not be performed at chamfering.

As a result, as shown in FIG. 9, variation in the shape of the chamfered portion was larger than that in example, and variation between chamfer widths A1, A2 exceeded ±20 μm. Thus, a notchless wafer with high shape precision could not be obtained.

It is to be noted that the present invention is not limited to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A chamfering apparatus comprising: a chamfering part for removing a notch by grinding an outer circumference of a wafer with a grindstone; a cleaning part for cleaning and drying a chamfered wafer; and a chamfered-shape measuring part for measuring a chamfered shape of a wafer washed and dried, the chamfering part, the cleaning part, and the chamfered-shape measuring part each including (i) a rotatable stage for rotatably holding the wafer and (ii) a control means for controlling a rotational position of the rotatable stage and a rotational position of a wafer held on the rotatable stage, each rotatable stage having a reference position serving as a reference of the rotational positions at a beginning of rotation, wherein the wafer is held such that the rotational position of the wafer at the beginning of rotation relative to the reference position is at the same rotational position on all rotatable stages, and the control means is configured to control the rotational position of the wafer so as to be at a predetermined position at the beginning of rotation and an end of rotation.

2. The chamfering apparatus according to claim 1, wherein each control means is further configured to control the rotational position of one rotatable stage so as to be within ±0.05 degree relative to the predetermined position at the beginning of rotation and the end of rotation.

3. The chamfering apparatus according to claim 1, wherein each control means includes a servomotor disposed at one rotatable stage and a rotary encoder built in the servomotor, the rotary encoder being capable of detecting the rotational positions, the servomotor being capable of controlling the rotational positions.

4. The chamfering apparatus according to claim 2, wherein each control means includes a servomotor disposed at one rotatable stage and a rotary encoder built in the servomotor, the rotary encoder being capable of detecting the rotational positions, the servomotor being capable of controlling the rotational positions.

5. A method for manufacturing a notchless wafer, the method comprising: stamping a crystal orientation mark at a certain position on a back surface of a wafer having a notch with respect to a certain crystal orientation by laser marking with reference to the notch; and chamfering the wafer to remove the notch, the chamfering including a chamfering step for removing the notch by grinding an outer circumference of the wafer aligned with reference to the notch with a grindstone, a cleaning step for cleaning and drying the wafer from which the notch is removed, and a chamfered-shape measuring step for measuring a chamfered shape of the wafer, wherein the wafer is rotatably held on a separate rotatable stage in each of the steps, such that a rotational position of the wafer at a beginning of rotation relative to a reference position is at the same rotational position on all rotatable stages, wherein the reference position serves as a reference of the rotational position, and the rotational position of the wafer held on the rotatable stage is controlled so as to be at a predetermined position at the beginning of rotation and an end of rotation.

6. The method for manufacturing a notchless wafer according to claim 5, wherein a rotational position of each rotatable stage is controlled so as to be within an accuracy of ±0.05 degree relative to the predetermined position at the beginning of rotation and the end of rotation.

7. The method for manufacturing a notchless wafer according to claim 5, wherein a servomotor and a rotary encoder built therein are disposed at each rotatable stage, the rotary encoder being capable of detecting the rotational position, the servomotor being capable of controlling the rotational position.

8. The method for manufacturing a notchless wafer according to claim 6, wherein a servomotor and a rotary encoder built therein are disposed at each rotatable stage, the rotary encoder being capable of detecting the rotational position, the servomotor being capable of controlling the rotational position.

* * * * *